United States Patent [19]

Homma et al.

[11] Patent Number: 5,176,078
[45] Date of Patent: Jan. 5, 1993

[54] SCREEN PRINTING MACHINE

[75] Inventors: Makoto Homma, Sawara; Norio Beppu, Tokyo, both of Japan

[73] Assignee: Hitachi Techno Engineering Co., Ltd., Tokyo, Japan

[21] Appl. No.: 887,794

[22] Filed: May 26, 1992

[30] Foreign Application Priority Data

May 27, 1991 [JP] Japan .................. 3-121112

[51] Int. Cl.$^5$ .............................................. B41L 13/02
[52] U.S. Cl. .................................. 101/126; 101/129
[58] Field of Search ............... 101/114, 126, 128.4, 101/129, DIG. 36

[56] References Cited

U.S. PATENT DOCUMENTS

| | | | |
|---|---|---|---|
| 3,941,053 | 3/1976 | Black et al. | 101/126 |
| 3,948,170 | 4/1976 | Ericcson | 101/126 |
| 4,203,360 | 5/1980 | Madwed | 101/129 |
| 4,226,181 | 10/1980 | Ericcson | 101/129 |
| 4,242,957 | 1/1981 | Mascloni et al. | 101/126 |
| 4,404,903 | 9/1983 | Cronin | 101/126 |
| 4,469,022 | 9/1984 | Meador | 101/126 |
| 4,516,495 | 5/1985 | Ericson | 101/129 |
| 4,610,200 | 9/1986 | Metso | 101/126 |
| 4,964,335 | 10/1990 | Klemm | 101/126 |

FOREIGN PATENT DOCUMENTS 59-997 1/1984 Japan .

Primary Examiner—Eugene H. Eickholt
Attorney, Agent, or Firm—Antonelli, Terry, Stout & Kraus

[57] ABSTRACT

A screen printing machine comprises a conveyor for conveying a substrate to a positioning station, an XY$\theta$ table on which the substrate is to be put, and a printing device for printing a pattern onto the substrate in a printing station. The XY$\theta$ table is movable in an XY$\theta$ plane in the positioning station and also movable along a Z-direction perpendicular to the XY$\theta$ plane. The machine further comprises a device for moving the printing device between the printing station and a waiting station, an image processing device and a driving device for the XY$\theta$ table. The image processing device recognizes a position of the substrate and calculates the respective amount of movement of the XY$\theta$ table in the XY$\theta$ plane necessary for making the predetermined relative positional relation between the printing device and the substrate. The driving device moves the XY$\theta$ table, based on the amounts of movement calculated by the image processing device.

9 Claims, 5 Drawing Sheets

SCREEN PRINTING MACHINE

FIELD OF THE INVENTION AND RELATED ART STATEMENT

This invention relates to a screen printing machine used for the application of paste solder or the like onto a substrate through a screen mask.

In conventional screen printing machines, as disclosed in Japanese Patent Unexamined Publication No. 59-997, a substrate is put on and carried by an XYθ table to a camera position where a camera is provided so that the substrate is set in position, based on an image monitored by the camera. The substrate is, further carried to a printing position where a mask is provided so that a pattern of the mask is printed on the substrate. After the printing process, the substrate is moved back by the XYθ table to the camera position. Subsequently, a new substrate is put on the XYθ table and the above operations are repeated.

According to the conventional technique described above, the XYθ table reciprocates the substrate between the camera position and the printing position. The reason for this is as follows. Namely, the mask is fixed to a printing frame and the printing frame is fixed in the printing position from the viewpoint of the accuracy of printing. As a result, positioning of the substrate must be performed in the position where there is provided no mask that interferes with the field of view of the camera. Subsequently, the substrate is carried by the XYθ table to the printing position.

In consequence, the XYθ table becomes heavy since it must be equipped with means for the positioning of the substrate. This results in enlargement of the sizes of a guide for the XYθ table and of driving means for the XYθ table. Further, it becomes necessary to provide a speed controlling and stopping means so as to cope with the inertia force generated on the movement of the XYθ table of a large mass, with the result that the apparatus is enlarged in size as a whole.

In case that the moving speed of the XYθ table is reduced for the purpose of decreasing the inertia force of the XYθ table, the number of substrates printed per unit time is reduced to thereby deteriorate the production efficiency.

Further, in the prior art the squeezer is supported at a center thereof and moved slidingly on the mask. Accordingly, in case of printing a substrate that has a relatively large area, this construction suffers from a problem that it is difficult to maintain the squeezer and the mask in parallel relation to each other with high accuracy. Therefore, there are caused differences in the amount of paste applied onto the substrate through the mask, resulting in that the pattern cannot be uniformly printed.

In addition, since the substrate is moved to the printing position after it is set in position, it takes much time to make preparations (arrangements) for execution of the printing, thereby deteriorating the productivity.

OBJECT AND SUMMARY OF THE INVENTION

An object of the present invention is to provide a screen printing machine which overcomes the above-described problems.

To this end, according to the present invention, there is provided a screen printing machine comprising a positioning station, a printing station, a waiting station, means for conveying a substrate to the positioning station, an XYθ table means on which the substrate is to be put, movable in a plane in the positioning station as well as movable along a Z-direction perpendicular to the plane, printing means for printing a pattern onto the substrate in the printing station, means for moving the printing means between the waiting station and the printing station, image processing means serving to recognize the position of the substrate from an image thereof obtained by monitoring the substrate in the positioning station using a camera and to calculate, based on the recognized position of the substrate, the respective amount of movement of the XYθ table means in the plane necessary for making the predetermined relative positional relation between the printing means and the substrate, and means for moving the XYθ table means based on the amounts of movement calculated by the image processing means.

DETAILED DESCRIPTION OF PREFERRED EMBODIMENT

Figure 1:
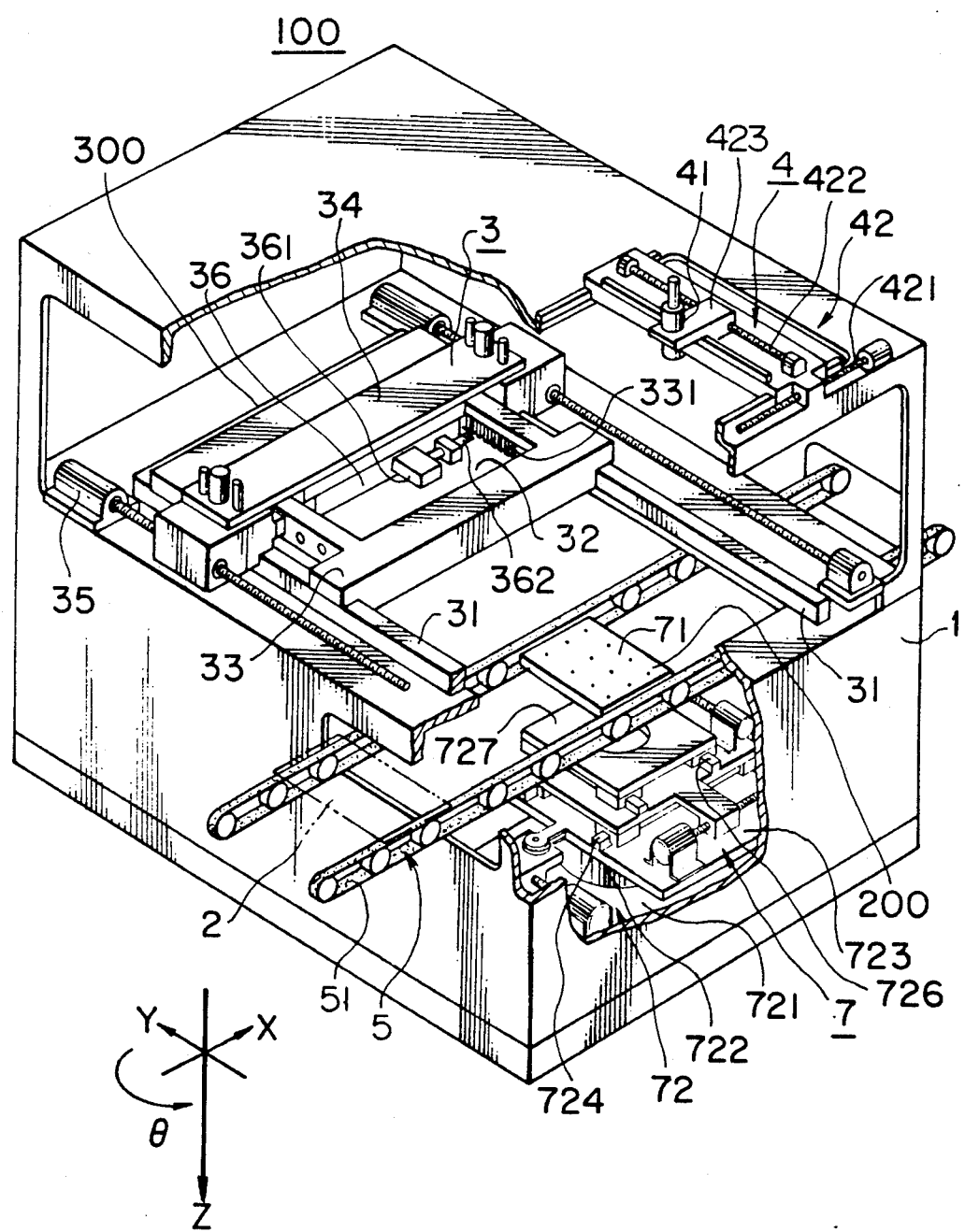
FIG. 1 is a fragmentary perspective view of a screen printing machine according to an embodiment of the present invention.
Figure 1A:
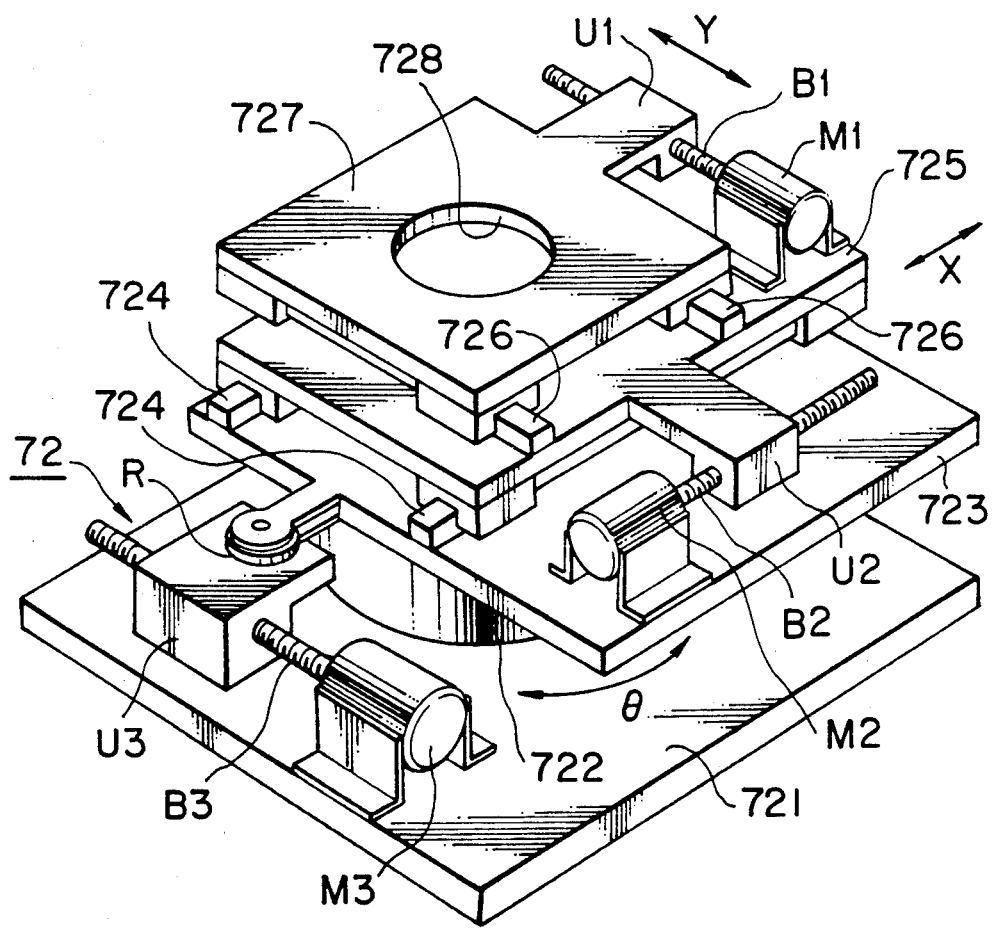
FIG. 1A is a perspective view showing an XYθ table means shown in FIG. 1.
Figure 2:
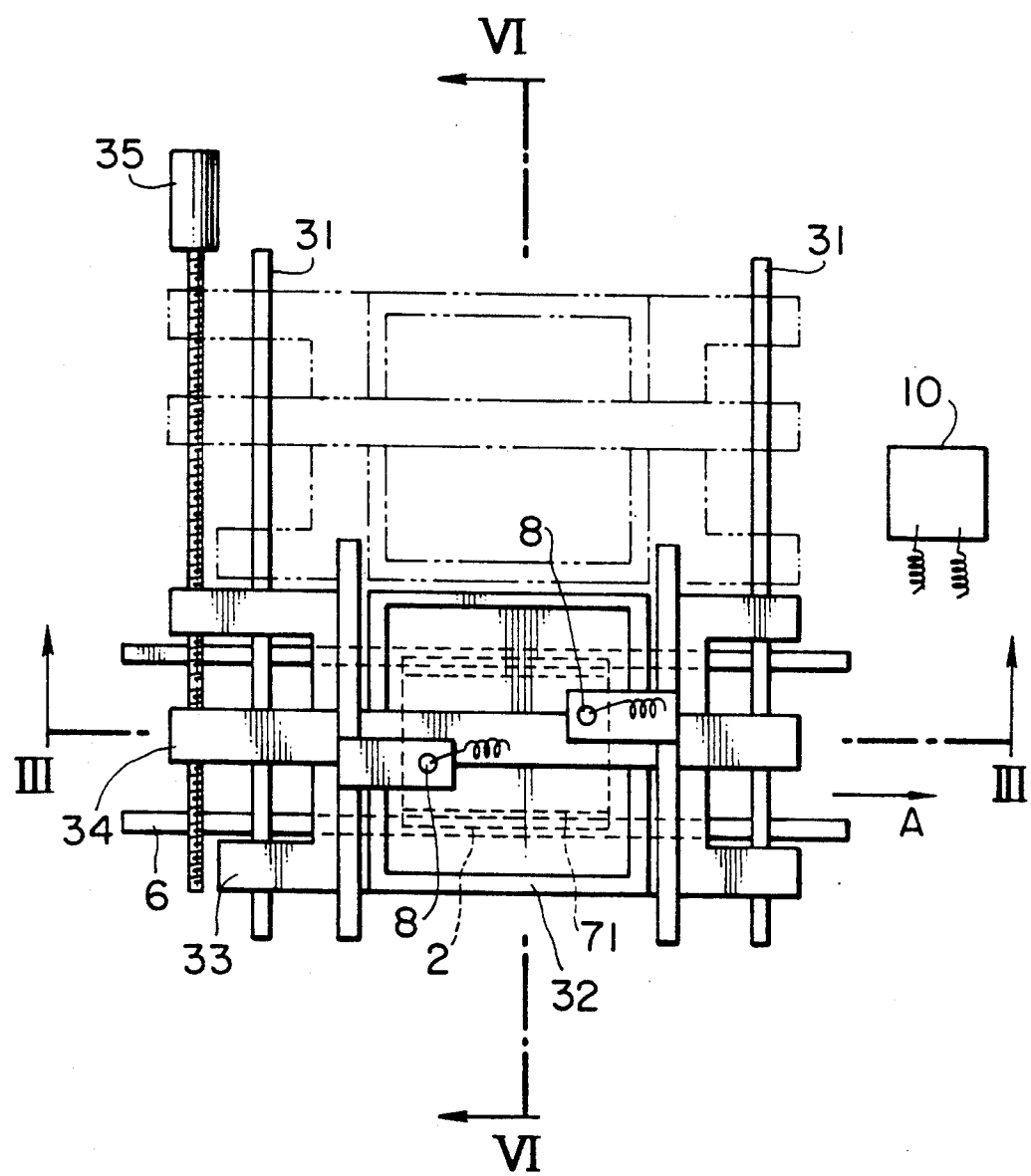
FIG. 2 is a plan view of the screen printing machine of FIG. 1 with a casing removed.
Figure 3:
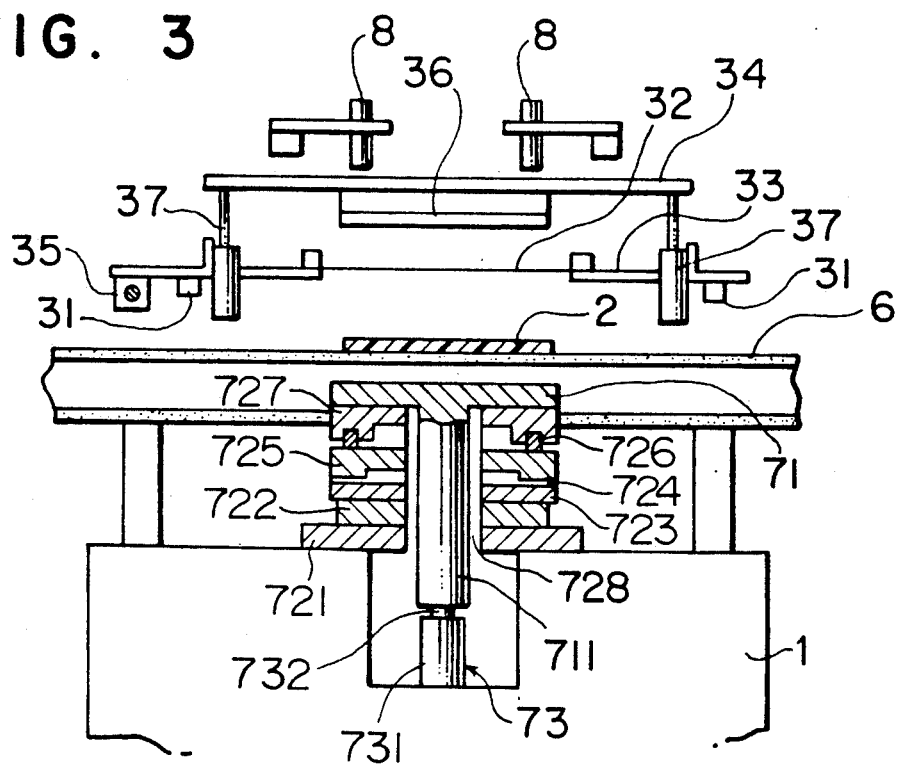
FIG. 3 is a sectional view taken along the line III—III of FIG. 2.

Referring to FIGS. 1 to 3, a screen printing machine 100 comprises a casing 1, a conveying means 5 for conveying a substrate 2 in X-direction, and an XYθ table means 7 provided below a conveying path of the conveying means 5. Above the XYθ table means 7 there is provided a printing station 200 which serves as a positioning station as well. Namely, the positioning station is located at the same level as the printing station in Z-direction which will be referred to later in detail. Further, a waiting station 300 is provided to be opposite to the printing station 200 in the direction perpendicular to the conveying direction of the conveying means 5. Above the printing station 200 there is provided a positioning means 4 serving to set the substrate 2 in position. A printing means 3 serving to print on the substrate 2 is provided at an intermediate level between the XYθ table means 7 and the positioning means 4. The conveying means 5 includes a conveyor 51 which extends through the interior of the casing 1 horizontally in X-direction to convey the substrate 2. The XYθ table means 7 includes a substrate cradle 71, an XYθ table unit 72, and a lift means 73. The cradle 71 receives the substrate 2 from the conveyor 51 in the printing station 200. The XYθ table unit 72 moves the substrate 2 through the substrate cradle 71 in X-direction, in Y-direction perpendicular to X-direction, and in a direction of an angular movement on a plane which contains X- and Y-directions, that is, in θ-direction.

The XYθ table unit 72 includes a base 721, a rotary bearing unit 722 mounted on the base 721, and a θ-table 723 mounted on the bearing unit 722. Further, on the θ-table 723 there are provided with a pair of straight rail guides 724 and a X-table 725 slidably mounted on the rail guides 724. A pair of straight rail guides 726 are provided on the X-table 725, which extend perpendicular to the rail guide 724. A Y-table 727 is slidably mounted on the rail guides 726. An opening is formed in each of the base 721 and the tables 723, 725 and 727 so as to define a passage 728 for the lift means 73. The lift means 73 reciprocates within through the passage 728. Motors M1 and M2 are provided on the tables 723 and 725, respectively. Ball screws B1, B2 are attached to the respective output shafts of the motors. Ball bearing units U1, U2 are provided with the respective tables 725 and 727, which engage with the ball screw. The motors M1 and M2 are driven to rotate the ball screws B1 and B2, thereby translating the tables 725 and 727 in X-direction and Y-direction, respectively. Further, a motor M3 is provided on the base 721. A ball screw B3 is attached to an output shaft of the motor M3. A ball bearing unit U3 engages with the ball screw B3 and is recessed to receive a roller R which is rotatable around an axis thereof and is integrated with the θ-table 723. In case that the motor M3 is driven, the ball screw B3 is rotated to translate the ball bearing unit U3. With the movement of the ball bearing unit U3, the roller R is rotated to swing the θ-table 723 on the bearing unit 722 in θ-direction. According this, the substrate 2 can be moved omnidirectionaly on the plane in the positioning station.

The lift means 73 moves the substrate 2 up and down along Z-direction perpendicular to X- and Y-directions through the substrate cradle 71. The lift means 73 includes a pneumatic or a hydraulic cylinder unit 731. A rod 732 of the cylinder unit 731 is connected to a shaft portion 711 of the substrate cradle 71. A bottom of the shaft portion 711 is brought into contact with a contact surface of the rod 732 such as to be movable in the horizontal direction (that is, on the X-Y plane). The positioning means 4 comprises a CCD camera 41 for monitoring the substrate 2 arrived in the printing station 200 and a device 42 for driving the CCD camera 41 in X- and Y-directions, provided on the casing 1. Based on the results of monitoring by the CCD camera, an image processing means 10 calculates an amount of movement of the substrate 2 in each direction which is necessary to set the substrate 2 in the predetermined position. The positioning means 4 forwards the information of necessary amount of movement of the substrate obtained from the image processing means 10 to the XYθ table unit 72. The XYθ table unit 72 moves the substrate 2 in accordance with this information. The camera driving device 42 comprises an X-direction mover 421 for moving the CCD camera 41 in X-direction, a Y-direction mover 422 provided on the X-direction mover 421 for moving the CCD camera 41 in the Y-direction and a camera carriage 423. Each of movers 421 and 422 includes a trapezoidal screw extending through the carriage 423. The camera 41 is moved in the X-Y plane by means of rotating the trapezoidal screws. The printing means 3 comprises a pair of guides 31 which extend below the CCD camera 41 between the printing station 200 and the waiting station 300 in Y-direction. The printing means 3 further comprises a printing frame 33 having a screen mask 32 slidably supported on the guides 31, a squeezing head assembly 34 with which the printing frame 33 is engaged and disengaged through a clutch, and a moving device 35 for moving the squeezing head assembly 34 together with the printing frame 33 or moving them separately along the guides 31. The moving device 35 includes, for example, a linear servo motor or a combination of a servo motor and a ball screw. A squeezer 36 is hung from the squeezing head assembly 34. The squeezing head assembly 34 is supported at opposite end portions thereof by means of a pair of pneumatic or hydraulic cylinder units 37 so as to be a double supported beam structure. Further, the supporting portions of the squeezing head assembly 34 are out of a field of vision of the CCD camera 41. The printing frame 33 is provided at a one side thereof with a rack 331. The squeezer 36 is provided at a portion thereof opposing the rack 331 with a cylinder unit 361 having a movable rod 362. A wedge shaped end of the rod 362 can enter into between the teeth of the rack 331 so as to unify the printing frame 33 and the squeezer 36. Namely, these elements constitutes the above-mentioned clutch.

Next, operation will be described with reference to FIGS. 4 to 6.

Figure 4:
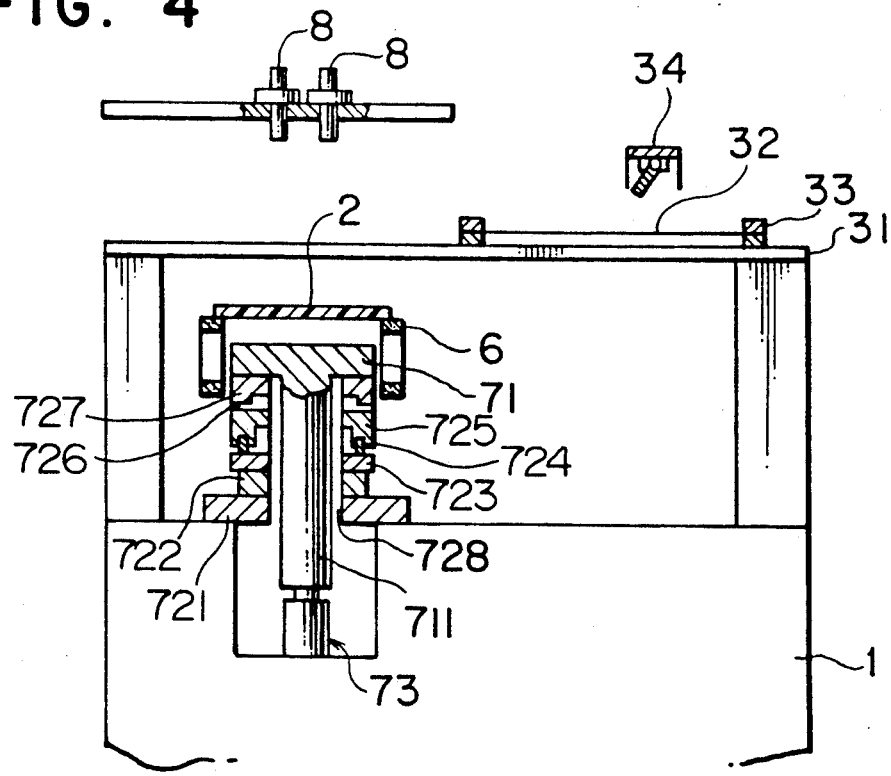
FIG. 4 is an illustration for the conveying process.

As shown in FIG. 4, the substrate 2 is carried by the conveyor 51 until it arrives at a position above the XYθ table unit 7 and comes to a halt. At this time, the screen mask 32, the printing frame 33 and the squeezing head assembly 34 of the printing means 3 are made to step aside in the position shown in FIG. 1, that is, in the waiting station 300. The screen mask 32 is supported by the printing frame 33 exactly.

Figure 5:
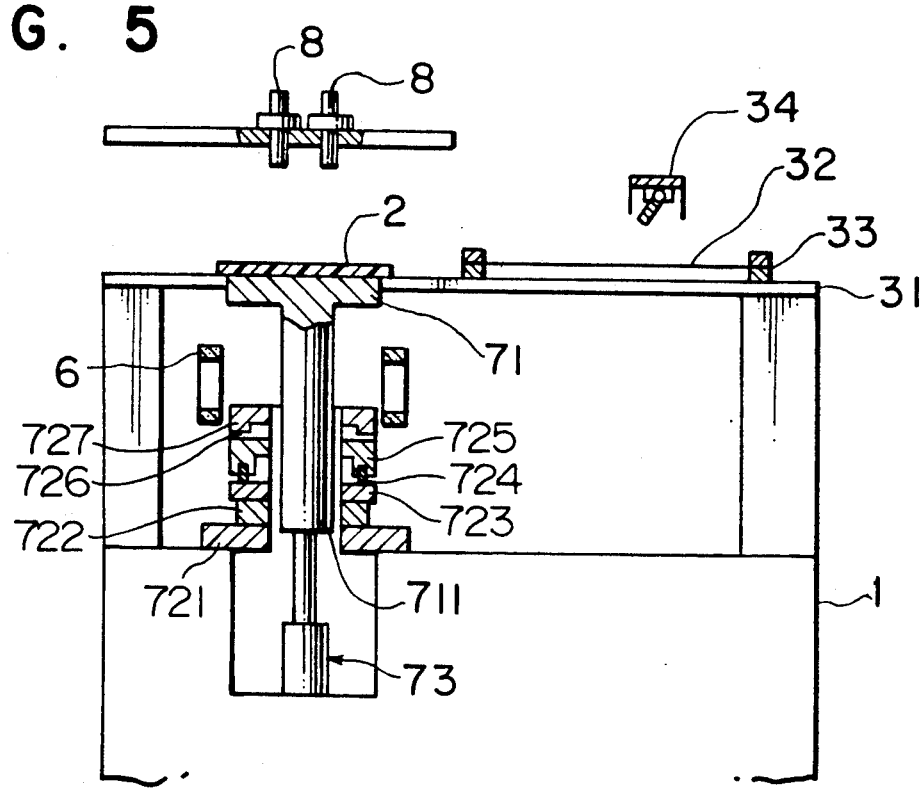
FIG. 5 is an illustration for the positioning process.
Figure 6:
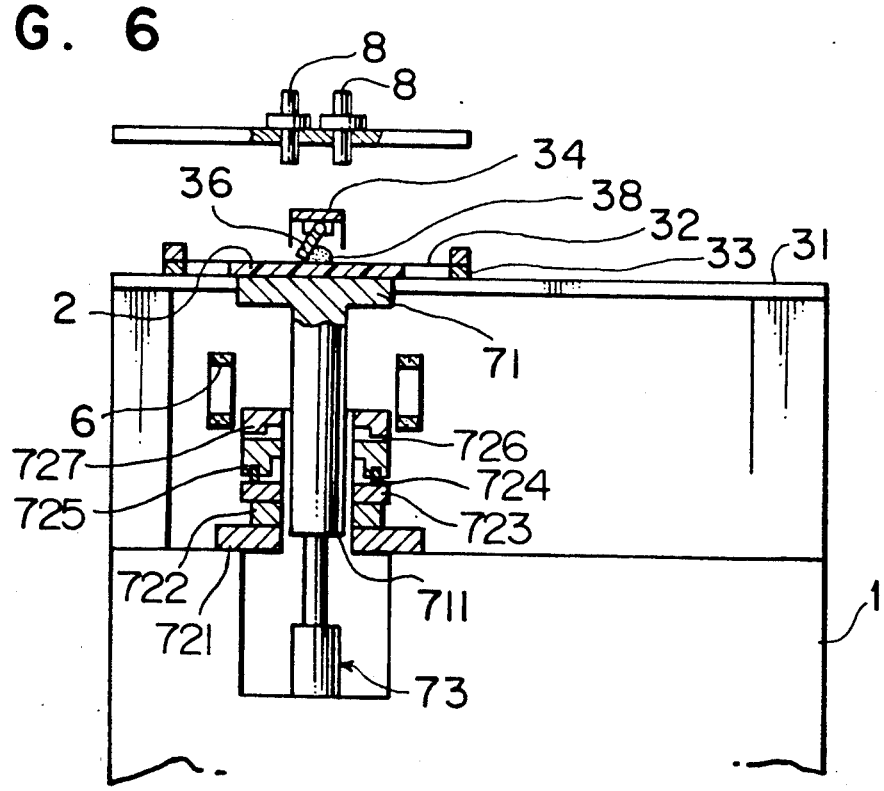
FIG. 6 is an illustration for the printing process, taken along the line VI—VI of FIG. 2.

In this condition, as the lift means 73 of the XYθ table unit 7 is driven to cause the substrate cradle to move upward, the substrate 2 on the conveyor 51 is received by the substrate cradle 71 as shown in FIG. 5. As the substrate cradle 71 is further moved upward by the lift means 73 until the upper surface of the substrate 2 arrives at the positioning-printing station, and then the substrate cradle 71 is stopped.

Subsequently, positioning marks on the substrate 2 are monitored by the CCD camera 41. The image processing means 10 calculates discrepancies between the position of the substrate read by the CCD camera 41 and the reference position thereof, and determines an amount of movement in each direction required for correcting the position of the substrate. The XYθ table 72 is so driven as to place the substrate into the reference position, based on driving signals corresponding to the amounts of movement determined by the image processing means 10. In this case, since there is provided a gap between the shaft portion 711 of the substrate cradle 71 and the XYθ table 72, there is nothing to hinder the substrate cradle 71 from moving.

Upon the completion of the positioning of the substrate 2, the printing frame 33 having the screen mask 32 and the squeezing head assembly 34 having the squeezer 36 are moved from the waiting station 300 to the printing station 200 along the guides 31 by the moving device 35 as they are unified by means of the clutch. In this case, since the printing frame 33, the squeezing head assembly 34 and the like to be moved are light, the inertia force generated on the movement is small. This makes it possible to move the printing frame 33, the squeezing head assembly 34 and the like at high-speed, and stop them at predetermined positions in the printing station 200 by small-capacity moving device 35. Further, in addition to the light weight, since the squeezing head assembly 34 is of the double-supported beam structure, the deflection of the squeezer 36 of the squeezing head assembly 34 can be readily restricted within narrow limits. Therefore, the squeezer 36 can be kept in parallel with the screen mask 32 throughout the overall length the screen mask 32. Accordingly, the pattern can be uniformly printed on the substrate. Further, even if there is an unparallelness therebetween, it can be possible to correct the unparallelness by means of driving either of the cylinder units 37. Then, after the clutch is released, the squeezing head assembly 34 is moved downward by the cylinder units 37 to the position where the squeezer 36 is brought into contact with the screen mask 32. Therefore, as shown in FIG. 6, the squeezer 36 is moved on the screen mask 32 by the moving device 35 with the screen mask 32 kept in contact with the substrate 2, so that paste solder 38 on the screen mask 32 is pressed by the squeezer 36 so as to be applied or printed onto the substrate 2 through the slits (not shown) formed in the screen mask 32.

Upon the completion of the printing, the squeezing head assembly 34 is moved upward by the cylinder units 37 so as to be separated from the screen mask 32 and the printing frame 33 is unified with the squeezing head assembly 34 through the clutch. Thereafter, the printing frame 33 is moved together with the squeezing head assembly 34 from the printing station 200 to the waiting station 300 along the guides 31. On the other hand, the lift means 73 is driven reversely so as to cause the substrate cradle 71 to be moved downward until the substrate 2 on the substrate cradle 71 is received by the conveyor 6. It carries out the substrate 2.

As has been described above, according to this embodiment, since the substrate is moved vertically together with the XYθ table, and it may be moved horizontally slightly, it is possible to reduce the time required for moving the substrate. This makes it possible to increase the number of substrates produced per unit time.

Further, the respective movements by the moving means and the lift means may be detected by an optical sensor or a limit switch, and trigger the succeeding operating means. Therefore, it is possible that a sequence of operations of the moving means and the lift means is carried out automatically by means of a microprocessor.

To the contrary, the following arrangement may be possible. Namely, positioning marks which are provided on the screen mask are to be picked up by the camera, and the positions thereof are calculated by the image processing means as reference positions. The substrate with corresponding positioning marks is moved by the XYθ table unit 72 so as to make them align with the reference positions. In this case, once the image processing means has read the positioning marks on the screen mask, it is sufficient after that only to read the positioning marks on the substrates to be carried in turn, thereby making it possible to increase the number of substrates produced per unit time.

According to another embodiment, it may be possible to locate the positioning station and the printing station at different levels in Z-direction. Namely, the substrate 2 may be positioned correctly at the positioning station and thereafter it may be moved upwards to the printing station.

In consequence, it is possible to obtain a screen printing machine which overcomes the above-described problems.

What is claimed is:
1. A screen printing machine comprising:
a positioning station;
a printing station;
a waiting station;
means for conveying a substrate to said positioning station;
an XYθ table means on which said substrate is to be put, movable in a plane in said positioning station as well as movable along a Z-direction perpendicular to said plane;
printing means for printing a pattern onto said substrate in said printing station;
means for moving said printing means between said waiting station and said printing station;
image processing means serving to recognize the position of said substrate from an image thereof obtained by monitoring said substrate in said positioning station using a camera and to calculate, based on the recognized position of said substrate, the respective amount of movement of said XYθ table means in said plane necessary for making the predetermined relative positional relation between said printing means and said substrate; and
means for moving said XYθ table means based on the amounts of movement calculated by said image processing means.

2. A screen printing machine according to claim 1, wherein said printing station and said waiting station are provided at an intermediate level in said Z-direction between said XYθ table means and said positioning means.

3. A screen printing machine according to claim 2, wherein said printing station is disposed above said XYθ table means, and said waiting station is disposed at the same level with said printing station and on a line extending from said printing station perpendicularly to a direction along which said substrate is conveyed by said conveying means.

4. A screen printing machine according to claim 1, wherein said printing means comprises a printing frame having a screen mask and a squeezing head assembly having a squeezer, and wherein said driving means comprises means for reciprocating said printing frame and said squeezing head assembly between said printing station and said waiting station and lift means serving to lift up and down said squeezing head assembly so as to bring said squeezer into contact with said screen mask during the printing process, said lift means supporting said squeezing head assembly at opposite ends thereof which are out of a field of vision of said camera.

5. A screen printing machine according to claim 4, wherein said squeezing head assembly and said printing frame are connected with each other through a clutch.

6. A screen printing machine according to claim 1, wherein said image processing means serves to calculate differences between a reference position of the substrate and the recognized position thereof as said necessary amount of movement.

7. A screen printing machine according to claim 1, wherein said image processing means serves to calculate differences between the position of said screen mask and the recognized position of the substrate as said necessary amount of movement.

8. A screen printing machine comprising:
a positioning station;
a printing station;
a waiting station;
means for conveying a substrate to said positioning station;
an XYθ table means on which said substrate is to be put, movable in a plane in said positioning station;

printing means for printing a pattern onto said substrate in said printing station;

means for moving said printing means between said waiting station and said printing station;

image processing means serving to recognize the position of said substrate from an image thereof obtained by monitoring said substrate in said positioning station using a camera and to calculate, based on the recognized position of said substrate, the respective amount of movement of said $XY\theta$ table means in said plane necessary for making the predetermined relative positional relation between said printing means and said substrate; and means for moving said $XY\theta$ table means based on the amounts of movement calculated by said image processing means.

9. A screen printing machine according to claim 8, wherein said positioning station and said printing station are located at the same level with respect to said Z-direction.

* * * * *